United States Patent
Yoshioka et al.

(10) Patent No.: US 6,541,126 B1
(45) Date of Patent: Apr. 1, 2003

(54) ELECTROLYTIC COPPER FOIL WITH CARRIER FOIL AND COPPER-CLAD LAMINATE USING THE ELECTROLYTIC COPPER FOIL

(75) Inventors: Junshi Yoshioka, Ageo (JP); Akiko Sugimoto, Ageo (JP); Sakiko Taenaka, Ageo (JP); Makoto Dobashi, Ageo (JP); Tsutomu Higuchi, Ageo (JP); Takuya Yamamoto, Ageo (JP); Ken-ichiro Iwakiri, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 09/830,122

(22) PCT Filed: Apr. 6, 2000

(86) PCT No.: PCT/JP00/02225

§ 371 (c)(1),
(2), (4) Date: Apr. 23, 2001

(87) PCT Pub. No.: WO01/14135

PCT Pub. Date: Mar. 1, 2001

(30) Foreign Application Priority Data

Aug. 24, 1999 (JP) ............................................ 11-237565

(51) Int. Cl.[7] .......................... B32B 15/04; B32B 15/20; B32B 7/04

(52) U.S. Cl. ........................ 428/624; 428/674; 428/675; 428/213; 428/457; 428/201

(58) Field of Search .................................. 428/674, 671, 428/626, 614, 675, 687, 609, 601, 213, 214, 215, 219, 220, 340, 341, 457, 469, 470, 689, 901, 935, 624, 201

(56) References Cited

U.S. PATENT DOCUMENTS

| | | | | | |
|---|---|---|---|---|---|
| 6,071,629 | A | * | 6/2000 | Yokota et al. | ............... 428/621 |
| 6,270,889 | B1 | * | 8/2001 | Kataoka et al. | ............. 428/352 |
| 6,319,620 | B1 | * | 11/2001 | Kataoka et al. | ............. 428/626 |
| 6,346,335 | B1 | * | 2/2002 | Chen et al. | ................. 428/629 |

\* cited by examiner

*Primary Examiner*—Deborah Jones
*Assistant Examiner*—Michael La Villa
(74) *Attorney, Agent, or Firm*—Jenkens & Gilchrist

(57) ABSTRACT

To provide an electrodeposited copper foil with carrier, in which electrical connection holes such as through holes (PTH), interstitial via holes (IVH), and blind via holes (BVH) can be readily formed. The invention provides an electrodeposited copper foil with carrier comprising a carrier foil, an organic release interface layer formed on a surface of the carrier foil, and an electrodeposited copper foil layer deposited on the release interface layer, wherein copper microparticles are deposited on the surface of the carrier foil onto which the organic release interface layer and the electrodeposited copper layer are formed.

5 Claims, 9 Drawing Sheets

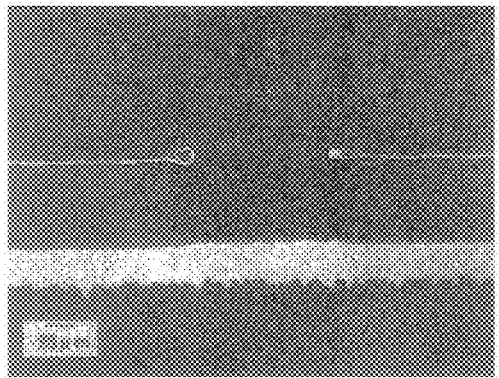
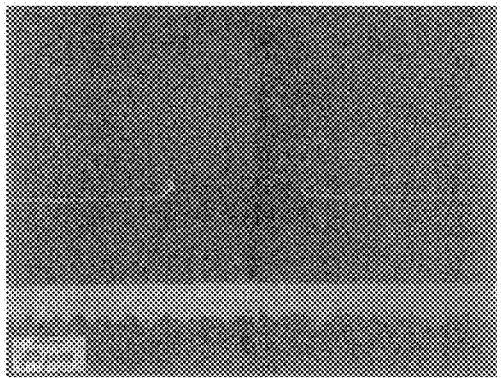
Fig. 3a            Fig. 3b
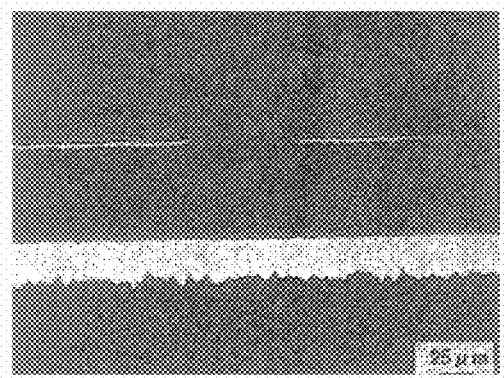
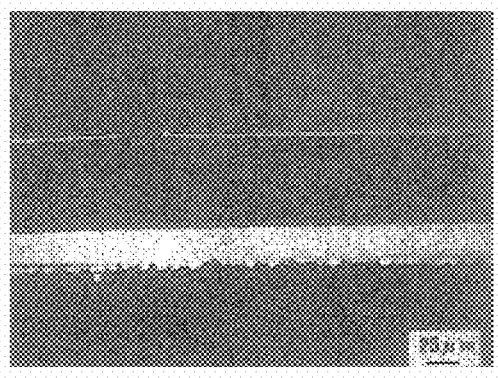
Fig. 3c            Fig. 3d

ELECTROLYTIC COPPER FOIL WITH CARRIER FOIL AND COPPER-CLAD LAMINATE USING THE ELECTROLYTIC COPPER FOIL

TECHNICAL FIELD

The present invention relates to electrodeposited copper foil with carrier and to a copper-clad laminate formed from the electrodeposited copper foil with carrier.

BACKGROUND ART

Conventionally, electrodeposited copper foil with carrier has been employed as a material for producing printed wiring boards, which are widely used in the electric and electronic industries. In general, electrodeposited copper foil with carrier is bonded through hot-pressing, onto an electrically insulating substrate such as glass-epoxy substrate, phenolic polymer substrate, or polyimide, to thereby form a copper-clad laminate, and the thus-prepared laminate is used for producing printed wiring boards.

Electrodeposited copper foil with carrier resists formation of wrinkles in the copper foil during hot pressing, and therefore prevents generation of cracks in the copper foil, which initiate from wrinkled portions. As a result, bleeding of resin from a prepreg is prevented. Thus, the copper foil with carrier has been attracting attention because these problems can be eliminated, and because foreign matter is prevented from penetrating into copper foil throughout the process of hot-pressing.

Specifically, the electrodeposited copper foil with carrier has a structure such that a carrier foil and an electrodeposited copper foil form a sheet as if surfaces of the two foils were bonded to each other. Such foils are subjected to hot press as they are, and the carrier foil is removed just before the copper foil is etched for producing a copper circuit. Thus, generation of wrinkles in the electrodeposited copper foil during handling or pressing thereof, and surface staining of a produced copper-clad laminate can be prevented.

Carrier foil, this term is used throughout the present description, is used in the form that one surface of the carrier foil is as if bonded to one surface of an electrodeposited copper layer. Copper is electrodeposited on one surface of the carrier foil so as to form a copper foil. Bonding of the carrier foil to the carrier foil is maintained at least until completion of the production of a copper-clad laminate. The carrier foil facilitates handling of the electrodeposited copper foil and is very effective in reinforcing and protecting the copper foil. Therefore, the carrier foil must exhibit a certain level of mechanical strength.

Any material may be used as the carrier foil so far as the material satisfies the aforementioned conditions, and generally, metal foils may serve well as the carrier foil. However, the carrier foil is not limited only to metal foils.

Electrodeposited copper foils with carrier are generally classified into two types; i.e., peelable foils and etchable foils. The present inventors have proposed a peelable electrodeposited copper foil with carrier in which the carrier foil and the copper foil are bonded via an organic release interface, since such a peelable electrodeposited copper foil exhibits remarkably improved releasability of the carrier foil from the copper foil.

However, in recent years, there has been increasing demand for a copper foil which permits easy handling during the etching and stacking processes employed in the production of printed wiring boards from a copper-clad laminate. This is because ever-increasing demand for downsizing of electronic and electric apparatus leads to strong demand for an increase in the number of layers in printed wiring boards; an increase in the density of a circuit formed from copper foil; and an increase in the packing density of mounted devices.

In order to further increase the density of a circuit formed from copper foil and the packing density of mounted devices, copper wirings for forming circuits are made finer and a number of substrates are stacked. Interlayer electrical connection is established by means of contact holes such as through holes (PTH), interstitial via holes (IVH), and blind via holes (BVH), which are formed by making predetermined holes in a printed wiring board. Although hole-making is conventionally carried out by means of a mechanical drill, high-precision processing by means of a $CO_2$ gas laser or the like has been employed in recent years so as to form a fine circuit from copper clad laminate.

Processing with a laser is very advantageous in that fine processing can be carried out with high precision. However, determination of processing conditions is quite difficult because copper foil used in printed wiring boards has a glossy surface and therefore reflects laser beams.

BRIEF DESCRIPTION OF THE DRAWINGS

FIG. 3 shows cross-sectional views of via holes observed after laser processing.

SUMMARY OF THE INVENTION

The present inventors have previously proposed a peelable electrodeposited copper foil with carrier in which the carrier foil and the copper foil are bonded via an organic adhesive interface. Thus, an object of the present invention is to enhance the bond strength of the interface between the carrier foil and the electrodeposited copper foil. Another object of the invention is to provide an electrodeposited copper foil with carrier exhibiting excellent performance suitable for etching or laser processing carried out after preparation of a copper-clad laminate. The present invention has been accomplished to attain these objects. The invention will next be described hereunder.

In the present invention, there is provided an electrodeposited copper foil with carrier comprising a carrier foil, an organic release interface layer formed on a surface of the carrier foil, and an electrodeposited copper foil layer deposited on the release interface layer, wherein copper microparticles are deposited on the surface of the carrier foil onto which the organic release interface layer and the electrodeposited copper layer are formed.

DETAILED DESCRIPTION OF THE INVENTION

Figure 1:
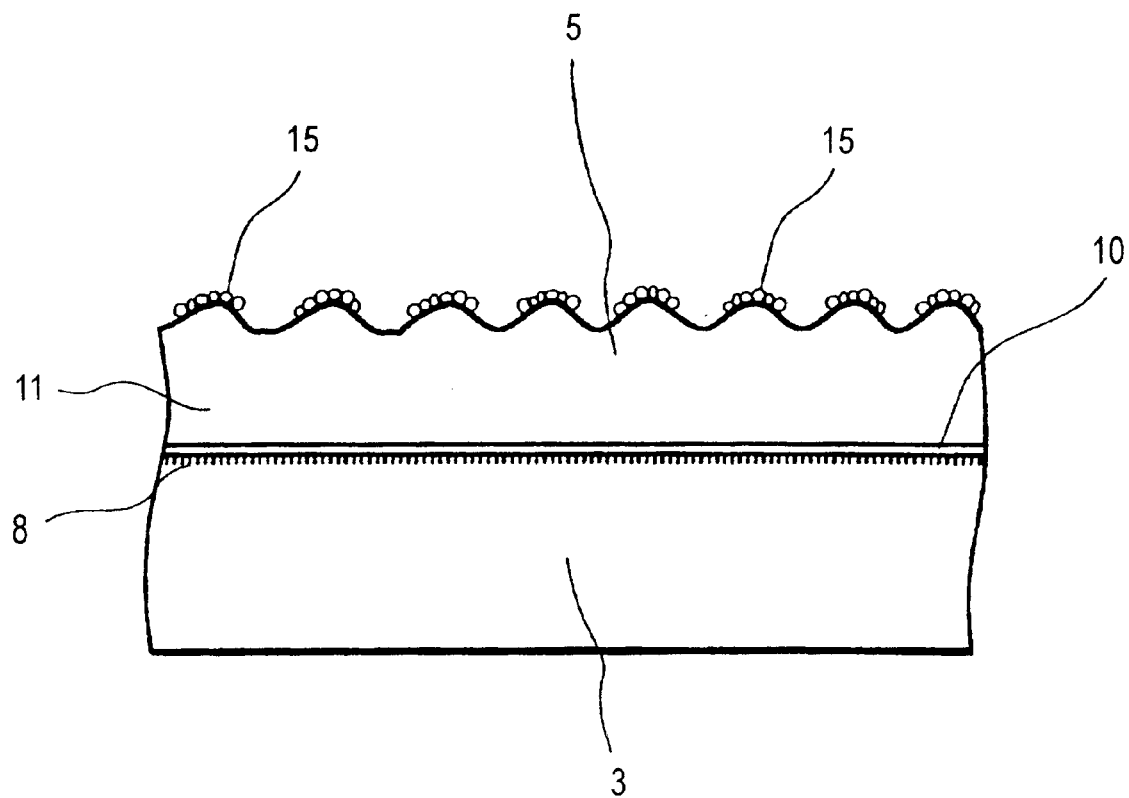
FIG. 1 is a schematic cross-sectional view of an electrodeposited copper foil with carrier.

As shown in the schematic cross-sectional view of FIG. 1, the electrodeposited copper foil with carrier comprises a carrier foil and an electrodeposited copper foil, as if one surface of one foil were bonded to one surface of the other foil. Throughout the present description, the terms "electrodeposited copper foil" and "electrodeposited copper foil layer" refer to the same portion, as is the case with "carrier foil" and "carrier foil layer"; and "release interface" and "release interface layer.". The alternative expressions are appropriately employed depending on descriptions.

The electrodeposited copper foil with carrier according to the present invention comprises a carrier foil having a surface onto which copper microparticles are deposited. Typically, these copper microparticles are deposited on a surface of a carrier foil through electrodeposition. Conventionally, the technical idea of depositing copper microparticles directly onto a surface of a carrier foil of an electrodeposited copper foil with carrier has never been proposed.

The reason why copper microparticles are deposited on a surface of a carrier foil will be described. In general, an electrodeposited copper foil with carrier is produced by forming a release interface layer on a surface of a carrier foil and electrodepositing copper on the surface of the carrier foil, thereby forming an electrodeposited copper foil layer. Therefore, when copper microparticles are formed on a surface of a carrier foil onto which copper has been electrodeposited in advance, the shapes of the microparticles are transferred to the surface of a copper foil which is formed on the release interface. Furthermore, a portion of the microparticles themselves is transferred to the copper foil when the carrier foil is released.

When the copper foil with carrier is laminated with a resin substrate by hot-pressing and the carrier foil is released off, the release-side surface of the copper foil serves as the top surface of a copper-clad laminate. In this case, the electrodeposited copper foil layer occupying the surface of the copper-clad laminate has a rough surface, due to copper microparticles deposited on the surface of a carrier foil, and the surface of the copper foil becomes matte. Since such a copper foil has a fine surface roughness as compared with customary copper foils, the copper foil has a surface color of brown to black.

Figure 2A:
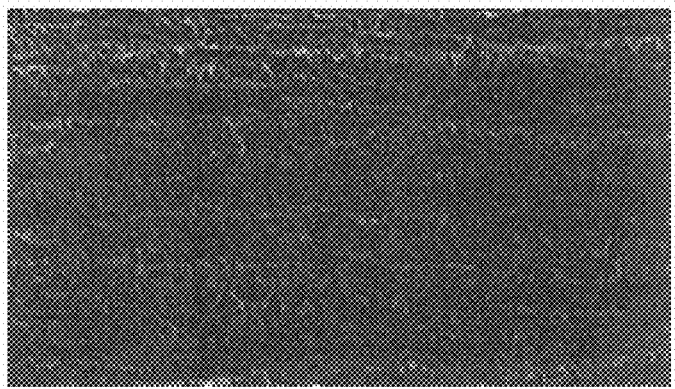
FIG. 2 shows SEM images of copper microparticles deposited on carrier foils.
Figure 2B:
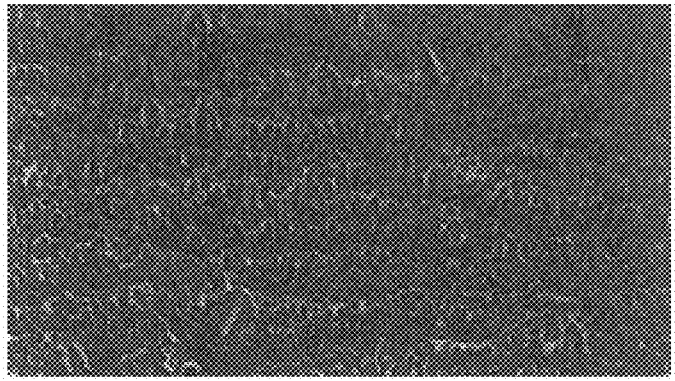
Figure 2C:

Preferably, the copper microparticles deposited on the carrier foil appear brown to black to the naked eye, and have a particle size of 0.01 μm to 5.0 μm. Since the microparticles are deposited through electrodeposition, the size and color of the particles generally attain a certain level of variance. Throughout the present description, the term "copper microparticles" encompasses those grown in needle-like or dendrite shapes obtained through electroplating under burnt plating conditions as well as spherical particles as shown in FIG. 2(a) to FIG. 2(c). When the microparticles have needle-like or dendrite shape, the particle size refers to a longer size.

By use of copper microparticles deposited on a carrier as shown in FIG. 2, several pieces of the electrodeposited copper foil with carrier according to the present invention were produced. The peel strength between the carrier foil and the electrodeposited copper foil was measured, and the results were 9.8 g/cm for FIG. 2(a), 60.2 g/cm for FIG. 2(b), and 110 g/cm for FIG. 2(c). These results indicate that the bond strength at the adhesive interface can be controlled by modifying the size of copper microparticles formed on the surface of a carrier foil.

The color of the developed surface of a copper foil after releasing a carrier foil shifts towards dark with decreasing size of the copper microparticles deposited on the carrier foil. When the size of the copper microparticles is 0.01 μm or less, particle formation and quality control of the formed particles are difficult from an industrial point of view, whereas when the particle size is 5.0 μm or more, copper particles are grown into dendrite shape which are readily crushed, thus elevating reflectance and gloss of the deposited surface, and hence the surface does not assume a brown to black color.

No particular limitation is imposed on the material of the carrier foil which can be employed in the present invention, and examples of the material include aluminum, copper, and metal-coated resin film. In addition, the thickness of the carrier foil is not particularly limited.

From an industrial point of view, materials having a thickness of 200 μm or less are generally called foils, and any materials may be employed so long as they can be called foils.

The organic agent used for forming the organic release interface layer is one or more species selected from nitrogen-containing organic compounds, sulfur-containing organic compounds, and carboxylic acids.

Among these compounds, the nitrogen-containing organic compounds may have a substituent. Specifically, substituted triazoles are preferably used. Examples include 1,2,3-benzotriazole (hereinafter referred to as BTA), carboxybenzotriazole (hereinafter referred to as CBTA), N',N'-bis(benzotriazolylmethyl) urea (hereinafter referred to as BTD-U), 1H-1,2,4-triazole (hereinafter referred to as TA), and 3-amino-1H-1,2,4-triazole (hereinafter referred to as ATA).

Examples of preferably employed sulfur-containing compounds include mercaptobenzothiazole (hereinafter referred to as MBT), thiocyanuric acid (hereinafter referred to as TCA), and 2-benzimidazolethiol (hereinafter referred to as BIT).

Monocarboxylic acids are preferably used as the carboxylic acids. Examples include oleic acid, linoleic acid, and linolenic acid.

Next will be described the modes for employing the aforementioned organic compounds in formation of an release interface layer on a carrier foil. Specifically, the release interface layer may be produced by dissolving the aforementioned organic agents in a solvent and immersing a carrier foil in the solution or applying the solution to a surface on which an release layer is to be formed, through methods such as showering, spraying, trickling, and electrodeposition. The method for forming the interface layer is not particularly limited. For any of the agents mentioned above, the concentration is preferably 0.01 g/l to 10 g/l, and the liquid temperature is preferably 20–60° C. The concentration of the organic agent is not particularly limited, and a solution of high concentration or a solution of low concentration can be employed without causing any particular problem.

The aforementioned organic agents are considered to be formed firmly on a surface of the carrier foil in accordance with a possible mechanism of formation of the release interface layer. For example, the organic agents are adsorbed on a metal oxide layer formed on the carrier foil and form chemical bonds with-oxygen species contained in the metal oxide layer, thereby stabilizing the organic agents forming the organic release layer.

Therefore, the higher the concentration, the higher the speed of adsorption of the organic agents to the carrier foil. Principally, the concentration of the organic agents is determined in accordance with the speed of the production line. The time for contact between the carrier foil and the solution containing the organic agents is also determined by the speed of the production line, and in practice is generally 5–60 seconds.

When the concentration is below the lower limit; i.e., 0.01 g/l, complete adsorption of the organic agents within a short period of time is difficult to attain and the thickness of the formed release interface layer varies, failing to maintain quality of the final product. When the concentration is in excess of the upper limit; i.e., 10 g/l, the adsorption speed does not increase commensurate with the amount of added organic agents. Such an excessive concentration is not advantageous from the viewpoint of production cost.

The release interface layer may be formed by. use of the aforementioned organic agent under the aforementioned conditions. The organic release interface layer preferably has a thickness of 5–100 mg/m$^2$ in terms of the weight of the release layer per unit area of the electrodeposited copper foil with carrier. A thickness falling within this range does not impair the conductivity of the carrier foil during formation of an electrodeposited copper foil layer. When the thickness is 5 mg/m$^2$ or less, the release layer encounters difficulty in providing appropriate peel strength, whereas when the thickness is 100 mg/m$^2$ or more, conduction of electricity in the carrier foil in the course of electrodeposition becomes unstable. Thus, when the thickness falls within the aforementioned range, an appropriate peel strength can be assured and electrodeposition of copper can be performed stably.

The formed organic release layer can be readily removed by washing with an acidic solution such as diluted sulfuric acid or diluted hydrochloric acid, and does not affect the production steps of printed wiring boards. At present, the aforementioned organic agents have been proven to provide no adverse effect on the production steps of printed wiring boards such as a variety of resist application steps, plating steps, and mounting steps.

The aforementioned release interface layer is formed on the carrier foil having a copper microparticles-deposited surface. Subsequently, an electrodeposited copper layer is formed on the release interface layer. The electrodeposited copper layer, which is a bulk copper layer, is formed directly on the carrier foil by cathodically polarizing the carrier foil per se in a copper electrolyte. Examples of copper electrolytes which can be used include copper sulfate and copper pyrophosphate.

The electrodeposited copper foil comprises a bulk copper layer and a surface-treated layer. The bulk copper layer serves as a conductor when the layer is formed into a circuit, and the surface-treated layer maintains adhesion during lamination of the copper foil to a substrate. Thus, after formation of the bulk copper layer is completed, the surface of the copper layer is subjected to nodular treatment to provide an anchor effect during bonding to a substrate and to passivation, namely anticorrosive treatment to prevent oxidation. Thus, the electrodeposited copper foil with carrier according to the present invention is obtained.

After a copper-clad laminate is produced by use of the electrodeposited copper foil with carrier, the carrier foil is released. Since the carrier foil has a surface on which cooper microparticles are deposited, the characteristics of the thus-formed rough surface are transferred to the surface of the electrodeposited copper foil, which assumes a brown to black color. The surface has a highly minute roughness, causing incident light to reflect turbulently. The brown to black color results from light absorbed by the surface of the copper foil. Such a minute surface roughness is considerably advantageous for forming a fine circuit pattern.

The physical properties of an electrodeposited copper foil required for forming a fine circuit pattern will be broadly summarized; i.e., 1) good adhesion to an etching resist; 2) good exposure conditions; 3) high etching rate; and 4) peel strength (including resistance to chemicals). The electrodeposited copper foil with carrier of the present invention satisfies the aforementioned physical properties. Particularly, the copper foil with carrier predominantly provides good adhesion to an etching resist and good exposure conditions.

When the adhesion between the copper foil and an etching resist increases, leaking of an etchant into the adhesive interface is prevented. Thus, the formed circuit exhibits a cross-section having a good aspect ratio, and a fine circuit can be formed with well-controlled impedance. In addition, excessive scattering of exposed light to an etching resist to be patterned during exposure can be prevented, since the copper foil surface has a matte surface as compared with the shiny side of conventional copper foil. Thus, broadening of exposed light at an edge portion of a circuit pattern can be mitigated.

Furthermore, the electrodeposited copper foil layer which is obtained from the electrodeposited copper foil with carrier according to the present invention has a minute surface structure. Therefore, when the copper foil is further plated, bond strength at the interface between the plated layer and the copper foil increases.

A most remarkable effect of the copper foil has also been observed. Specifically, the surface roughness of the aforementioned copper foil layer is also highly advantageous for laser hole formation employed for forming contact holes such as through holes (PTH), interstitial via holes (IVH), and blind via holes (BVH).

Figure 4:
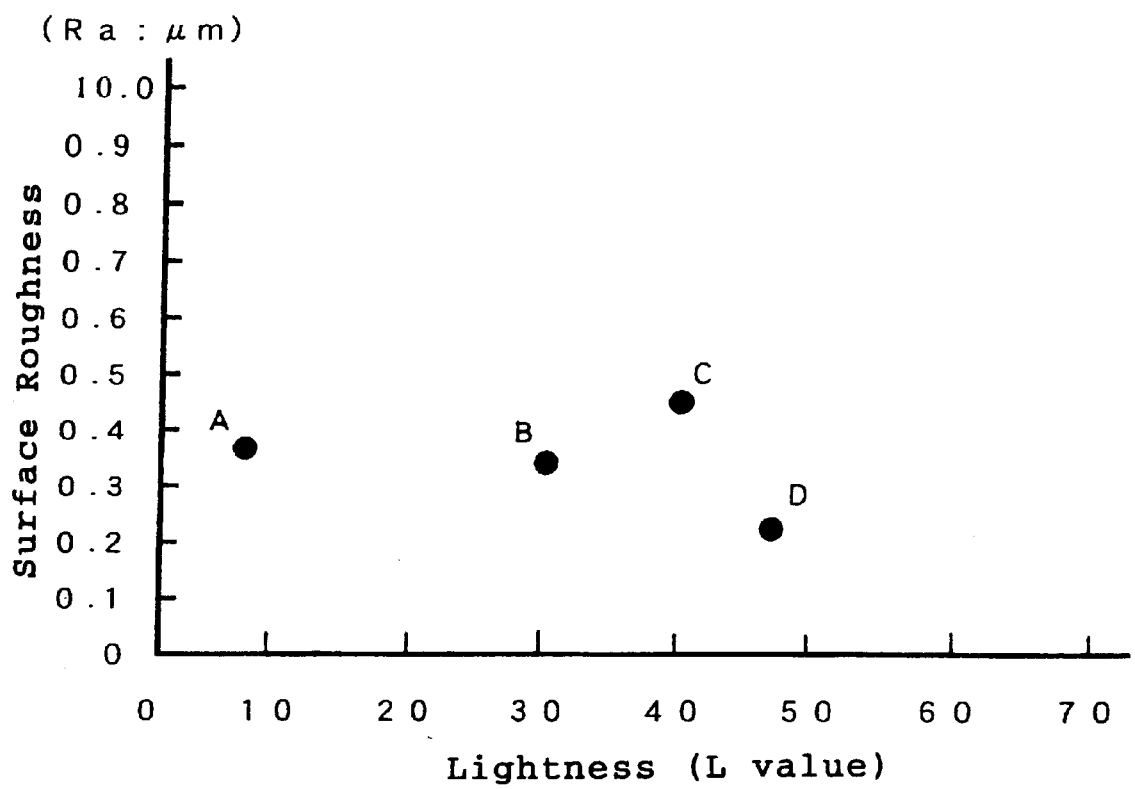
FIG. 4 is a graph showing the relationship between lightness and reflectance of developed surfaces of electrodeposited copper foils after the carrier foils have been released.
Figure 5:
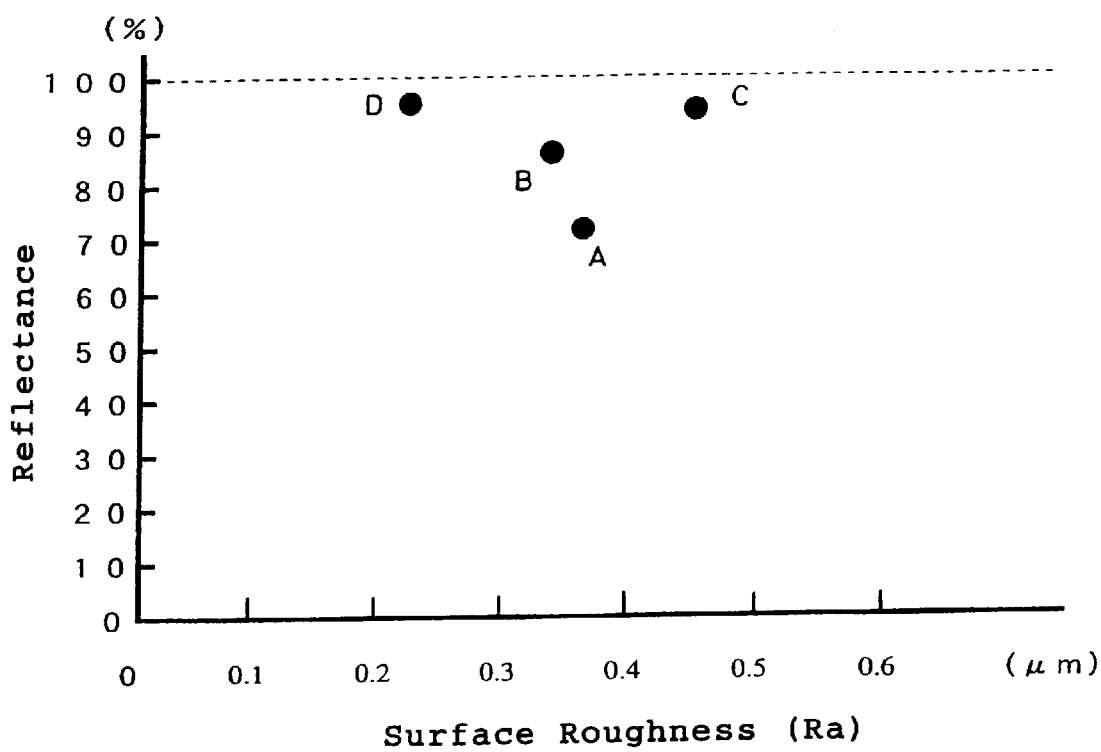
FIG. 5 is a graph showing the relationship between reflectance and surface roughness of developed surfaces of electrodeposited copper foils after the carrier foils are released.
Figure 6:
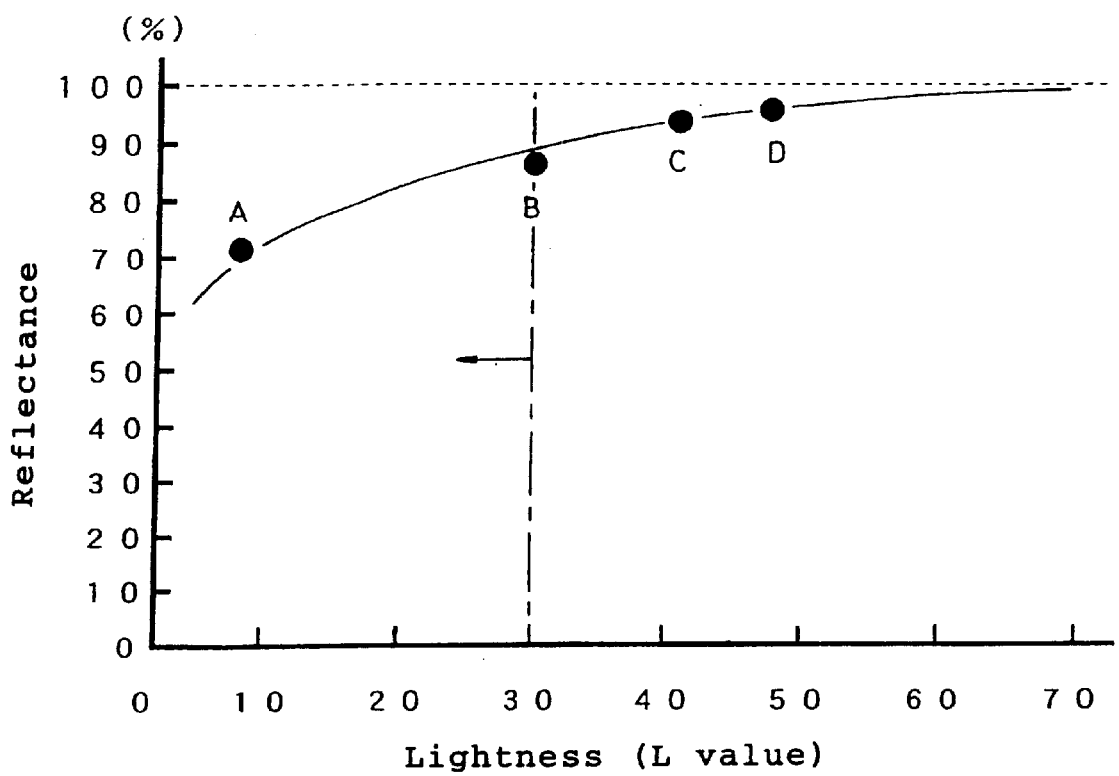
FIG. 6 is a graph showing the relationship between reflectance and lightness of developed surfaces of electrodeposited copper foils after the carrier foils have been released.

Since the electrodeposited copper foil layer obtained from the electrodeposited copper foil with carrier according to the present invention has minute surface roughness, exposed light including a laser beam is effectively absorbed by the surface. FIGS. 4 to 6 show relationships between properties of the copper foil surface.

As shown in FIG. 2, copper-clad laminates were formed from carrier foil having copper microparticles of several different types formed thereon. The present inventors have elucidated the optimum parameters for laser hole formation, by comparing the surface conditions of the copper foil with three parameters; i.e., reflectance, lightness, and surface roughness.

Four types of outer layer copper foils of copper-clad laminates were evaluated. The reflectance, lightness, surface roughness, and laser hole formability of each foil are shown in Table 1. For the purpose of judging relationships between parameters and simplicity in description, data from four samples are employed.

TABLE 1

| Sample No. | Reflectance (%) | Lightness | Surface roughness/ Ra ($\mu$m) | Laser hole formability |
|---|---|---|---|---|
| A | 71 | 7.99 | 0.368 | good |
| B | 86 | 30.00 | 0.331 | fair |
| C | 93 | 40.01 | 0.443 | poor |
| D | 95 | 47.18 | 0.222 | |

The laser hole formability shown in FIG. 1 was evaluated through observation of the shape of a cross-section of a small hole formed by laser processing as shown in FIG. 3. The photographs shown in FIG. 3 correspond to cross-sections of small holes formed in samples A to D. The employed conditions for laser processing were: apparatus: LCO-1A21 ($CO_2$ laser, product of Hitachi Seiko); wavelength: 9.3 $\mu$m; frequency: 2000 Hz; mask: 5.0 mm-diameter; pulse width: 1 shot, 20 $\mu$s, 20 mJ; and offset: 0.8. The shapes of the cross-sections are evaluated as "good" for sample A; "fair" for sample B; and poor for samples C and D. Since the samples were subjected to one-shot processing, these photographs show fins in the outer layer copper foil. In general, the fins can be made smooth by successive exposure to a laser beam.

The relationships between the parameters were investigated on the basis of the data shown in Table 1. In FIG. 4, lightness and surface roughness are plotted. As is clear from FIG. 4, no clear relationship between lightness and surface roughness can be obtained. Although lightness and surface roughness do not correlate, lightness and laser hole formability correlate in consideration of evaluation of hole formability.

In FIG. 5, reflectance and surface roughness are plotted. As is clear from FIG. 5, no clear relationship between reflectance and surface roughness can be obtained. Although reflectance and surface roughness do not correlate, reflectance and laser hole formability do correlate, in consideration of evaluation of hole formability.

In FIG. 6, reflectance and lightness are plotted. As is clear from FIG. 6, a logarithmic relationship between reflectance and lightness is found. The higher the lightness, the closer the reflectance approaches 100%. Thus, the present inventors have conducted a number of experiments employing a number of samples, and have found that when a copper foil of a copper-clad laminate has a surface having a reflectance of 86% or less and lightness (L value) of 30 or less; i.e., lightness falling within a region defined by the chain line and specified with an arrow shown in FIG. 6, satisfactory laser hole formability can be attained, judging from the extrapolated curve in FIG. 6. In the description, the term "lightness (L value)" represents an index of the Lab color system, which is widely employed for evaluating chromaticity and lightness. The employed color-difference meter was SZ-Σ80 (product of Nippon Denshoku Kogyo).

There is provided an electrodeposited copper foil with carrier described above wherein copper microparticles are deposited on the surface of the carrier foil onto which the organic adhesive interface layer and the electrodeposited copper layer are formed, the copper foil surface exhibiting a laser beam ($CO_2$ laser, wavelength of 9.3 $\mu$m) reflectance of 86% or less after releasing the carrier foil.

As is clear from the above description, the lightness of the outer layer copper foil of a copper-clad laminate is also a suitable index for monitoring laser hole formability. Thus, there is provided an electrodeposited copper foil with carrier described wherein copper microparticles are deposited on the surface of the carrier foil onto which the organic release interface layer and the electrodeposited copper layer are formed, the copper foil surface exhibiting a lightness of 30 ($CO_2$ laser, wavelength of 9.3 $\mu$m) or less after releasing the carrier foil.

Particularly, when holes are formed simultaneously in a copper foil and a substrate constituting a copper-clad laminate, process conditions at an initial stage of laser beam irradiation are important. Thus, the holes must be formed uniformly at an initial stage of laser beam irradiation. If the holes are formed in the outer copper foil layer without attaining uniformity at an initial stage, uniform holes cannot be formed in the substrate and the thus-formed holes come to have rough inner surfaces.

The substrate is formed of a prepreg, which typically comprises glass fiber impregnated with a resin such as an epoxy resin or a melamine resin, the resin being semi-cured. The prepreg and a copper foil are hot-pressed and completely cured, to thereby prepare a copper-clad laminate.

The completely cured prepreg is a type of fiber-reinforced plastics, and glass fiber therein forms glass cloth. The glass cloth and the resin in the prepreg differ in laser hole formability, and uniform laser beam irradiation is required. Thus, a copper foil exhibiting high laser beam absorption (low reflectance) at an initial stage is employed in a copper-clad laminate so as to form uniform, flat holes in the copper foil. As a result, the substrate is subjected to uniform irradiation with a laser beam, and holes can be formed with higher precision.

Preferably, a resin layer is provided on the copper foil in the electrodeposited copper foil with carrier according to the present invention, and a circuit substrate (inner core material of a multi-layer printed wiring board) is bonded via the resin layer serving as an adhesive. Such a resin-coated electrodeposited copper foil with carrier can provide an insulating resin layer containing no glass cloth between the outer and inner copper foils serving as a second layer, further improving laser hole formability.

In one aspect of the invention there is provided a copper-clad laminate employing an electrodeposited copper foil with carrier as described above. The copper-clad laminate employs the aforementioned electrodeposited copper foil with carrier. No particular limitation is imposed on the laser source employed for processing the aforementioned copper-clad laminate, and an argon gas laser or a $CO_2$ gas laser may be employed. When the laser irradiation has a comparatively short wavelength, the absorption thereof is comparatively high, making the laser abration more effective. Laser radiation conditions may be selected in consideration of the material and substrate thickness.

EXAMPLES

Embodiments for carrying out the present invention will next be described. In the following examples, methods for producing the electrodeposited copper foil with carrier of the present invention and copper-clad laminates produced from the electrodeposited copper foil with carrier are described, along with results of evaluation of the foils. The carrier foil described in the following examples is formed with an electrodeposited copper foil. In the Figures, when possible, identical portions are denoted by the same reference numeral.

Example 1

Figure 7:
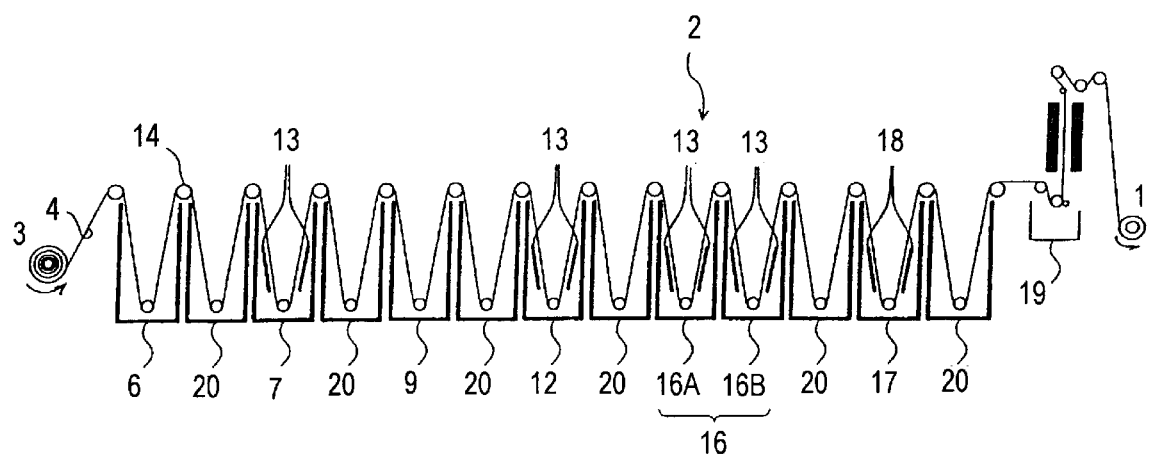
FIG. 7 is a schematic cross-sectional view of an apparatus used for producing an electrodeposited copper foil with carrier.

The electrodeposited copper foil with carrier 1 according to the present invention will be described with reference to FIG. 1. An apparatus 2 for producing the foil is shown in FIG. 7. In the apparatus, a carrier foil 3 is unwinded from a foil roll and travels, in a winding manner, along the process line for forming an electrodeposited copper foil layer 5. A drum foil (electrodeposited copper foil that had not been subjected to any surface treatment) having a thickness of 18 μm and classified as grade 3 was employed as the carrier foil 3, and the electrodeposited copper foil layer 5 having a thickness of 5 μm was formed on a shiny side 4 of the drum foil.

The shiny side 4 of a drum foil is essentially formed on electrodeposited copper foil through the following process. Specifically, a drum foil is produced in an electro-forming cell which comprises a rotating drum cathode, and a lead anode facing and at least partially surrounding the drum cathode, and contains a copper sulfate solution. During electrolysis, copper is electrodeposited on the drum as copper foil, which is continuously transferred to a foil surface through peeling from the rotating drum cathode.

The drum foil surface which is touched on the cathode is glossy and smooth, since a mirror-finished surface of the rotating cathode is transferred to the foil surface. The thus-obtained surface is called the shiny side. In contrast, the surface configuration of the other surface, on which copper is electrodeposited, is rough, since the growth rate of copper varies depending on the deposited crystal plane. Thus, this surface is called the matte side. The matte side serves as a surface onto which an insulating material is bonded during production of a copper-clad laminate. Hereinafter, production conditions of electrodeposited copper foils with carrier will be described with reference to an apparatus where a variety of baths are continuously arranged in-line.

Firstly, the carrier foil 3 taken from the foil roll was transferred into an acid pickling cell 6 filled with a diluted sulfuric acid solution having a concentration of 150 g/l at 30° C. The carrier foil was immersed for 30 seconds, to remove oily matter and surface oxide film from the surface of the carrier foil 3.

After the carrier foil 3 was treated in the acid pickling cell 6, the foil was transferred into a copper-microparticle-forming bath 7 filled with a solution having a copper concentration of 13.7 g/l and a sulfuric acid concentration of 150 g/l at 25° C. In the bath 7, electroplating was carried out at a current density of 5–15 A/dm² (10 A/dm² in the present embodiment) for 10 seconds, depositing a copper microparticles layer 8 on one surface of the carrier foil 3. In this case, the carrier foil 3 per se was polarized to serve as a cathode, and, as shown in FIG. 7, anode plates 13 were placed so as to face one surface of the carrier foil 3 in parallel. The surface conditions of the formed copper microparticles layer 8 were modified to approximate those shown in FIG. 2(b).

After the carrier foil 3 had been treated in the copper-microparticles-forming bath 7, the foil was transferred into a release-interface-forming bath 9 filled with a 5 g/l aqueous solution of CBTA (pH 5) at 40° C. The carrier foil 3 was run into the bath and immersed for 30 seconds, forming on a surface of the carrier foil 3 a release interface layer 10 having a thickness corresponding to 30 mg/m².

Subsequently, a bulk copper layer 11 of the electrodeposited copper foil was formed on the release interface layer 10. A bulk-copper-forming bath 12 was filled with a copper sulfate solution having a sulfuric acid concentration of 150 g/l and a copper concentration of 65 g/l at 45° C. While the carrier foil 3 having an release interface layer 10 passes through the solution, a bulk copper layer 11 is formed. In order to deposit copper uniformly and smoothly on the release interface layer 10, as shown in FIG. 7, anode plates 13 were placed such that the anode plates faced in parallel one surface of the carrier foil 3. Electroplating was carried out for 60 seconds under uniform plating conditions and at a current density of 15 A/dm². In this case, at least one tension roll 14 maintaining contact with the running carrier foil 3 served as a current-supplier so as to polarize the carrier foil 3 per se to a cathode.

After completion of formation of a bulk copper layer 11 is completed, the carrier foil 3 was transferred into a nodular treatment bath 16 in order to form anchor copper microparticles 15 on the surface of the bulk copper layer 11. The anchor copper microparticles 15 assure bonding strength between the copper foil and a substrate during production of a copper-clad laminate. The treatment carried out in the nodular treatment bath 16 involves depositing anchor copper microparticles 15 on the bulk copper layer 11 (step 16A) and seal-plating so as to prevent dropping out of the anchor copper microparticles 15 (step 16B).

Step 16A, depositing anchor copper microparticles 15 on the bulk copper layer 11 employed a copper sulfate solution (sulfuric acid concentration of 100 g/l, copper concentration of 18 g/l, temperature 25° C.) similar to that employed in the bulk-copper-forming bath 12, and electroplating was carried out for 10 seconds under conditions forming burnt deposit at a current density of 10 A/dm². In this case, as shown in FIG. 7, anode plates 13 were placed such that the anodes plates faced the anchor-copper-deposited surface of the carrier foil 3 in parallel.

Step 16B, seal-plating so as to prevent dropping out of the anchor copper microparticles 15, employed a copper sulfate solution (sulfuric acid concentration of 150 g/l, copper concentration of 65 g/l, temperature 45° C.) similar to that employed in the bulk-copper-forming bath 12, and electroplating was carried out for 20 seconds under uniform plating conditions and at a current density of 15 A/dm². In this case, as shown in FIG. 7, anode plates 13 were placed such that the anodes plates faced the anchor-copper-deposited surface of the carrier foil 3 in parallel.

Passivation, namely anti-corrosion treatment was carried out in a passivation bath 17, by use of zinc as a corrosion-inhibiting element. The concentration of zinc in the passivation bath 17 was maintained by employment of a zinc plate as a dissolving anode 18. The electroplating was carried out in a zinc sulfate bath (sulfuric acid concentration of 70 g/l, zinc concentration of 20 g/l, temperature of 40° C.) at a current density of 15 A/dm².

After completion of the anti-corrosion treatment, the carrier foil 3 was passed through, over 40 seconds, a drying furnace 19 where the atmosphere was heated to 110° C., to thereby produce an electrodeposited copper foil with carrier 1, which was then wound into a roll. During the aforementioned steps, the carrier foil ran at 2.0 m/minute. The foil was then rinsed with water in a water-rinsing bath 20 capable of performing about 15 sec water-washing and disposed between successive operation baths, thereby preventing the solution from being carried over from the previous bath.

Figure 8:
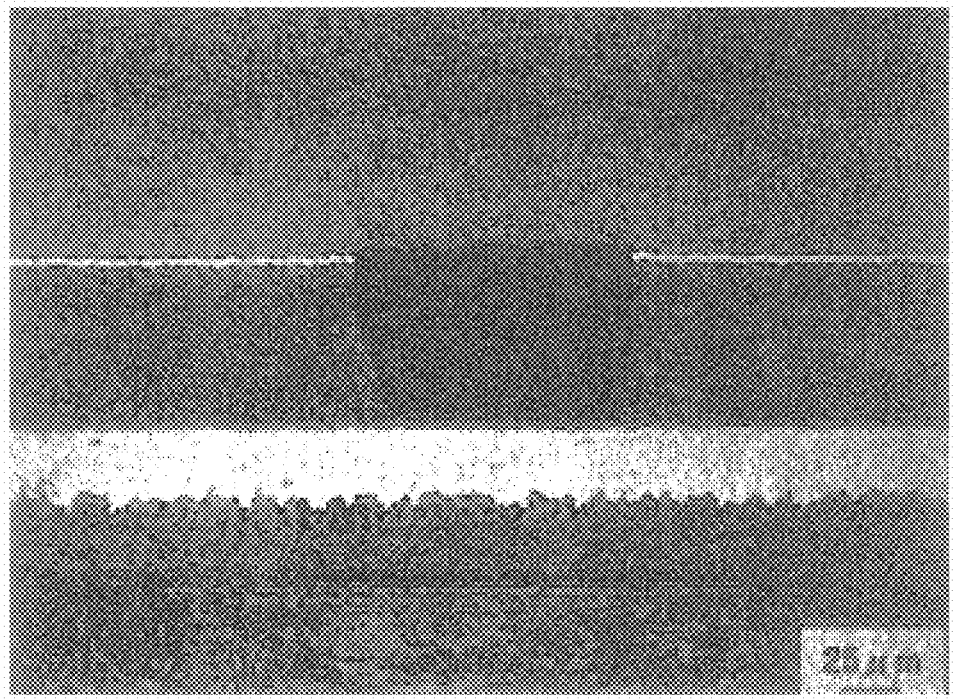
FIG. 8 shows cross-sectional views of via holes as observed after laser processing.

On the thus-passivation-treated electrodeposited copper foil with carrier 1, a resin layer having a thickness of 70 μm was formed, to thereby obtain a resin-coated electrodeposited copper foil with carrier 1. The thus-obtained copper foil 1 was hot-pressed with a core material sheet, an inner layer circuit being formed on both surfaces, to thereby form a copper-clad laminate having four layers. The outer copper foil after releasing of carrier foil 3 had a reflectance of 84% and a lightness of 28, and formed copper microparticles had a particle size of 1–2.0 μm. The peel strength at the release interface 8 between the carrier foil layer 3 and the electrodeposited copper foil layer 5 was measured. The peel strength of the electrodeposited copper foil with carrier 1 was 60.0 gf/cm before heating, and 61.3 gf/cm after hot-pressing at 180° C. for one hour. In addition, via holes were formed through laser processing. As shown in FIG. 8, good hole-formability was attained.

Furthermore, the present inventors repeated the experiment, except that palmitic acid, stearic acid, oleic acid, linoleic acid, linolenic acid, or mercaptobenzoic acid was used as the aforementioned organic agent instead of CBTA. The results of peel strength as measured on the interface 8 between the carrier foil layer 3 and the electrodeposited copper foil layer 5, before and after heating, are summarized in Table 2. In addition, via holes were formed in each electrodeposited copper foil with carrier through laser processing after releasing carrier foil. As shown in FIG. 8, good via holes were obtained.

TABLE 2

| Organic agent forming release interface | Peel strength (gf/cm) | |
|---|---|---|
| | before heating | after heating |
| CBTA | 60 | 61 |
| palmitic acid | 104 | 110 |
| stearic acid | 78 | 85 |
| oleic acid | 105 | 118 |
| linoleic acid | 82 | 102 |
| linolenic acid | 97 | 106 |
| mercaptobenzoic acid | 78 | 85 |
| BTD-U | 46 | 48 |
| MBT | 59 | 62 |
| TCA | 41 | 44 |
| BTA | 68 | 83 |
| BIT | 40 | 55 |
| TA | 53 | 72 |
| ATA | 61 | 62 |

Example 2

The procedure of Example 1 was repeated, except that the composition of the solution employed in the copper-microparticles-forming bath 7 and electrolysis conditions were changed. Thus, the solution employed in the copper-microparticle-forming bath 7 will be described, and descriptions of other details are omitted.

The copper-microparticles-forming bath 7 was filled with a solution having a copper concentration of 7.0 g/l, a sulfuric acid concentration of 80–110 g/l, and an arsenic concentration of 1.8 g/l at 25° C. In the bath 7, electroplating was carried out at a current density of 5–15 A/dm² (10 A/dm² in this case) for 15 seconds, depositing a copper microparticle layer 8 on one surface of the carrier foil 3. In this case, the carrier foil 3 per se was polarized to serve as a cathode, and, as shown in FIG. 7, anode plates 13 were placed such that the anode plates faced the foil in parallel.

Figure 9:
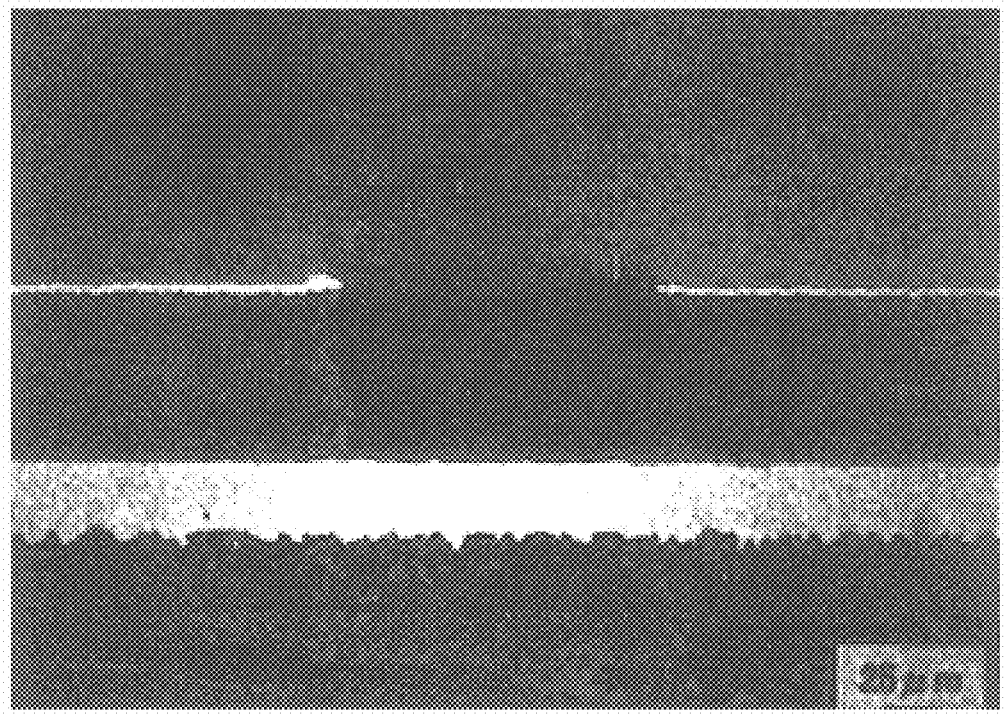
FIG. 9 shows cross-sectional views of via holes as observed after laser processing.

On the thus-passivation-treated electrodeposited copper foil with carrier 1, a resin layer having a thickness of 70 μm was formed, to thereby obtain a resin-coated electrodeposited copper foil with carrier 1. The thus-obtained copper foil was hot-pressed with a core material sheet, an inner layer circuit being formed on both surfaces, to thereby form a copper-clad laminate having four layers. The outer copper foil after releasing carrier foil 3 had a reflectance of 82% and a lightness of 26, and copper microparticles formed had a particle size of 1–2.0 μm. The peel strength at the adhesive interface 8 between the carrier foil layer 3 and the electrodeposited copper foil layer 5 was measured. The peel strength of the electrodeposited copper foil with carrier 1 was 58.0 gf/cm before heating, and 58.0 gf/cm after hot-pressing at 180° C. for one hour. In addition, via holes were formed through laser processing. As shown in FIG. 9, good hole-formability was attained.

Furthermore, the present inventors repeated the experiment, except that palmitic acid, stearic acid, oleic acid, linoleic acid, linolenic acid, or mercaptobenzoic acid was used as the aforementioned organic agent instead of CBTA. The results of peel strength as measured on the interface 8 between the carrier foil layer 3 and the electrodeposited copper foil layer 5, before and after heating, are summarized in Table 3. In addition, via holes were formed in each electrodeposited copper foil with carrier through laser processing. As shown in FIG. 9, good via holes were obtained.

TABLE 3

| Organic agent forming release interface | Peel strength (gf/cm) | |
|---|---|---|
| | before heating | after heating |
| CBTA | 58 | 58 |
| palmitic acid | 95 | 101 |
| stearic acid | 67 | 79 |
| oleic acid | 100 | 118 |
| linoleic acid | 74 | 93 |
| linolenic acid | 82 | 91 |
| mercaptobenzoic acid | 80 | 85 |
| BTD-U | 41 | 43 |
| MBT | 49 | 59 |
| TCA | 37 | 39 |
| BTA | 56 | 70 |
| BIT | 34 | 48 |
| TA | 50 | 67 |
| ATA | 51 | 54 |

Effects of the Invention

The electrodeposited copper foil with carrier according to the present invention enables releasing of the carrier foil layer from the electrodeposited copper foil layer at the interface between the two layers with little peel force. The copper foil with carrier maintains stable releasability of the carrier foil from the interface, whereas conventional peel-able electrodeposited copper foils with carrier have not attained such releasability. When the carrier foil is removed, the developed surface of the electrodeposited copper foil with carrier is readily improved in absorptivity of a laser beam. Thus, forming holes by laser processing is easier and the yield of production of printed wiring boards can be remarkably improved.

What is claimed is:

1. An electrodeposited copper foil with carrier comprising a carrier foil, an organic release interface layer formed on a surface of the carrier foil, and an electrodeposited copper foil layer deposited on the release interface layer, characterized in that copper micro-particles are deposited on the surface of the carrier foil and thereafter the organic release interface layer and the electrodeposited copper layer are formed on the carrier foil with copper micro-particles.

2. An electrodeposited copper foil with carrier according to claim 1,
   wherein the organic release interface layer has a thickness by weight of 5 mg/m² to 100 mg/m².

3. An electrodeposited copper foil with carrier according to claim 2, wherein the organic agent used for forming the consisting of nitrogen-containing organic compounds, sulfur-containing organic compounds, and carboxylic acids.

4. An electrodeposited copper foil with carrier according to claim 1, including copper micro-particles deposited on the surface of the carrier foil onto which the organic release interface layer and the electrodeposited copper layer are formed, wherein after removal of the carrier foil the exposed surface of said electrodeposited copper foil exhibits a $CO_2$ gas laser beam reflectance of 86% or less.

5. An electrodeposited copper foil with carrier according to claim 1, including copper micro-particles deposited on the surface of the carrier foil onto which the organic release interface layer and the electrodeposited copper layer are formed, wherein after removal of the carrier foil the exposed surface of said electrodeposited copper foil exhibits a lightness of 30 or less.

* * * * *

UNITED STATES PATENT AND TRADEMARK OFFICE
CERTIFICATE OF CORRECTION

PATENT NO.    : 6,541,126 B1
DATED         : April 1, 2003
INVENTOR(S)   : Junshi Yoshioka et al.

It is certified that error appears in the above-identified patent and that said Letters Patent is hereby corrected as shown below:

<u>Column 12,</u>
Line 67, after "forming the", insert -- organic release interface layer is selected from the group --

Signed and Sealed this

Ninth Day of December, 2003

JAMES E. ROGAN
*Director of the United States Patent and Trademark Office*